(12) United States Patent
Tang

(10) Patent No.: US 10,879,499 B2
(45) Date of Patent: Dec. 29, 2020

(54) DISPLAY MODULE, MANUFACTURING METHOD THEREOF AND ELECTRONIC DEVICE

(71) Applicant: Wuhan China Star Optoelectronics Semiconductor Display Technology Co., Ltd., Wuhan (CN)

(72) Inventor: Wei Tang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 54 days.

(21) Appl. No.: 16/319,538

(22) PCT Filed: Jan. 3, 2019

(86) PCT No.: PCT/CN2019/070290
§ 371 (c)(1),
(2) Date: Jan. 22, 2019

(87) PCT Pub. No.: WO2020/113754
PCT Pub. Date: Jun. 11, 2020

(65) Prior Publication Data
US 2020/0185658 A1    Jun. 11, 2020

(30) Foreign Application Priority Data
Dec. 3, 2018 (CN) .......................... 2018 1 1464859

(51) Int. Cl.
*H01L 51/52* (2006.01)
*H01L 51/56* (2006.01)

(52) U.S. Cl.
CPC ...... *H01L 51/5293* (2013.01); *H01L 51/5246* (2013.01); *H01L 51/56* (2013.01); *H01L 2251/5338* (2013.01); *H01L 2251/56* (2013.01)

(58) Field of Classification Search
CPC . H01L 51/5293; H01L 51/56; H01L 51/5246; H01L 2251/5338; H01L 27/3258; H01L 27/3246; H01L 27/1248
See application file for complete search history.

(56) References Cited

U.S. PATENT DOCUMENTS

| | | | |
|---|---|---|---|
| 2016/0226021 A1* | 8/2016 | Lee | H01L 51/5237 |
| 2016/0260780 A1* | 9/2016 | Kim | H01L 51/0097 |
| 2017/0294621 A1 | 10/2017 | Higano et al. | |
| 2018/0088261 A1* | 3/2018 | Song | G02F 1/133514 |
| 2019/0148679 A1 | 5/2019 | Li | |
| 2019/0204639 A1* | 7/2019 | Wu | G02F 1/133308 |
| 2020/0088912 A1* | 3/2020 | Li | G02B 1/14 |

FOREIGN PATENT DOCUMENTS

| | | |
|---|---|---|
| CN | 106557187 | 4/2017 |
| CN | 107610598 | 1/2018 |
| CN | 108269500 | 7/2018 |

* cited by examiner

*Primary Examiner* — Mohammed R Alam

(57) ABSTRACT

The present disclosure proposes a display module, a manufacturing method, and an electronic device. The display module includes a display panel, a polarizing layer on the display panel, a cover layer on the polarizing layer, and an adhesive layer between the polarizing layer and the cover layer. The adhesive layer is a viscosity-releasing adhesive layer.

17 Claims, 2 Drawing Sheets

DISPLAY MODULE, MANUFACTURING METHOD THEREOF AND ELECTRONIC DEVICE

RELATED APPLICATIONS

This application is a National Phase of PCT Patent Application No. PCT/CN2019/070290 having International filing date of Jan. 3, 2019, which claims the benefit of priority of Chinese Patent Application No. 201811464859.2 filed on Dec. 3, 2018. The contents of the above applications are all incorporated by reference as if fully set forth herein in their entirety.

FIELD AND BACKGROUND OF THE INVENTION

The present disclosure relates to the field of display, and more particularly, to a display module, a method of manufacturing the display module, and an electronic device adopting the display module.

As the development of flexible organic light-emitting diode (OLED) displays, which are widely applied in the display industry, more and more high-end cellphones adopt a flexible OLED display instead of a liquid-crystal display (LCD) display of the related art.

However, due to immaturity of full lamination technology for the flexible OLED display, the yield rate of the flexible OLED display in full lamination is quite low. Furthermore, the flexible OLED display is characterized by that a slit easily produces in an encapsulating layer whenever the force tears the encapsulating layer, resulting in damage to the flexible OLED display. Dismantling utilization of the flexible OLED display is almost zero using an optical adhesive of the related art and adopting a dismantling method of the related art. As a result, the flexible OLED display fails to be repaired.

Therefore, the present disclosure proposes a new display module to solve the technical problem in the related art.

SUMMARY OF THE INVENTION

The present disclosure proposes a display module, a method of manufacturing the display module, and an electronic device using the display module to solve the technical problem in the related art that the successful repairing rate for a flexible organic light-emitting diode (OLED) display of the related art is low.

According to a first aspect of the present disclosure, a display module includes a display panel, a polarizing layer on the display panel, a cover layer on the polarizing layer, and an adhesive layer between the polarizing layer and the cover layer. The adhesive layer is a viscosity-releasing adhesive layer.

According to an embodiment of the present disclosure, the adhesive layer is an ultraviolet (UV) viscosity-releasing optical adhesive.

According to an embodiment of the present disclosure, the cover layer comprises a hard layer and a filter layer arranged between the hard layer and the adhesive layer. The display panel comprises a light-emitting device layer of which an orthographic projection on the filter layer is arranged in the filter layer.

According to an embodiment of the present disclosure, an area of the filter layer is greater than an area of a light-emitting region of the display module.

According to an embodiment of the present disclosure, the cover layer further comprises a light-shielding layer; the light-shielding layer is arranged on the hard layer and at both sides of the filter layer. A sum of an area of the light-shielding layer and an area of the filter layer is equal to an area of the hard layer.

According to an embodiment of the present disclosure, a material for the light-shielding layer comprises ink.

According to a second aspect of the present disclosure, a method of manufacturing a display module includes: providing a hard layer; forming a polarizing layer on the display panel; forming an adhesive layer on the polarizing layer; forming a cover layer on the adhesive layer. The adhesive layer is a viscosity-releasing adhesive layer.

According to an embodiment of the present disclosure, the adhesive layer is an ultraviolet (UV) viscosity-releasing optical adhesive.

According to an embodiment of the present disclosure, the step of forming the cover layer on the adhesive layer comprises: providing a hard layer; forming a filter layer on the hard layer; forming a light-shielding layer at both sides of the filter layer; bonding the hard layer where the filter layer is formed to the polarizing layer with the adhesive layer; a sum of the area of the light-shielding layer and the area of the filter layer is equal to the area of the hard layer.

According to an embodiment of the present disclosure, an area of the filter layer is greater than an area of a light-emitting region of the display module.

According to an embodiment of the present disclosure, the display panel comprises a light-emitting device layer of which an orthographic projection on the filter layer is arranged in the filter layer.

According to an embodiment of the present disclosure, a material for the light-shielding layer comprises ink.

According to an embodiment of the present disclosure, the filter layer is an ultraviolet (UV) filter layer.

According to a third aspect of the present disclosure, an electronic device includes a display module. The display module includes a display panel, a polarizing layer on the display panel, a cover layer on the polarizing layer, and an adhesive layer between the polarizing layer and the cover layer. The adhesive layer is a viscosity-releasing adhesive layer.

According to an embodiment of the present disclosure, the adhesive layer is an ultraviolet (UV) viscosity-releasing optical adhesive.

According to an embodiment of the present disclosure, the cover layer comprises a hard layer and a filter layer arranged between the hard layer and the adhesive layer. The display panel comprises a light-emitting device layer of which an orthographic projection on the filter layer is arranged in the filter layer.

According to an embodiment of the present disclosure, an area of the filter layer is greater than an area of a light-emitting region of the display module.

According to an embodiment of the present disclosure, the cover layer further comprises a light-shielding layer; the light-shielding layer is arranged on the hard layer and at both sides of the filter layer. A sum of an area of the light-shielding layer and an area of the filter layer is equal to an area of the hard layer.

According to an embodiment of the present disclosure, a material for the light-shielding layer comprise ink.

According to an embodiment of the present disclosure, the filter layer is an ultraviolet (UV) filter layer.

The present disclosure brings a benefit as introduced below. In the present disclosure, an ultraviolet (UV) release adhesive layer is substituted for an adhesive layer arranged between a cover layer and a polarizing layer. It is because that it is easy to lose the viscosity after the UV viscosity-releasing adhesive layer is subjected to UV light. Lack of the viscosity, the UV viscosity-releasing adhesive layer is separated from the polarizing layer easily. Further, the successful repairing rate for the display module is greatly improved.

BRIEF DESCRIPTION THE SEVERAL VIEWS OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF SPECIFIC EMBODIMENTS OF THE INVENTION

In the disclosure, it is should be understood that spatially relative terms, such as "center", "longitudinal", "lateral", "length", "width", "above", "below", "front", "back", "left", "right", "horizontal", "vertical", "top", "bottom", "inner", "outer", "clockwise", "counterclockwise", "axial", "radial", "circumferential", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The spatially relative terms are not limited to specific orientations depicted in the figures.

Figure 1:
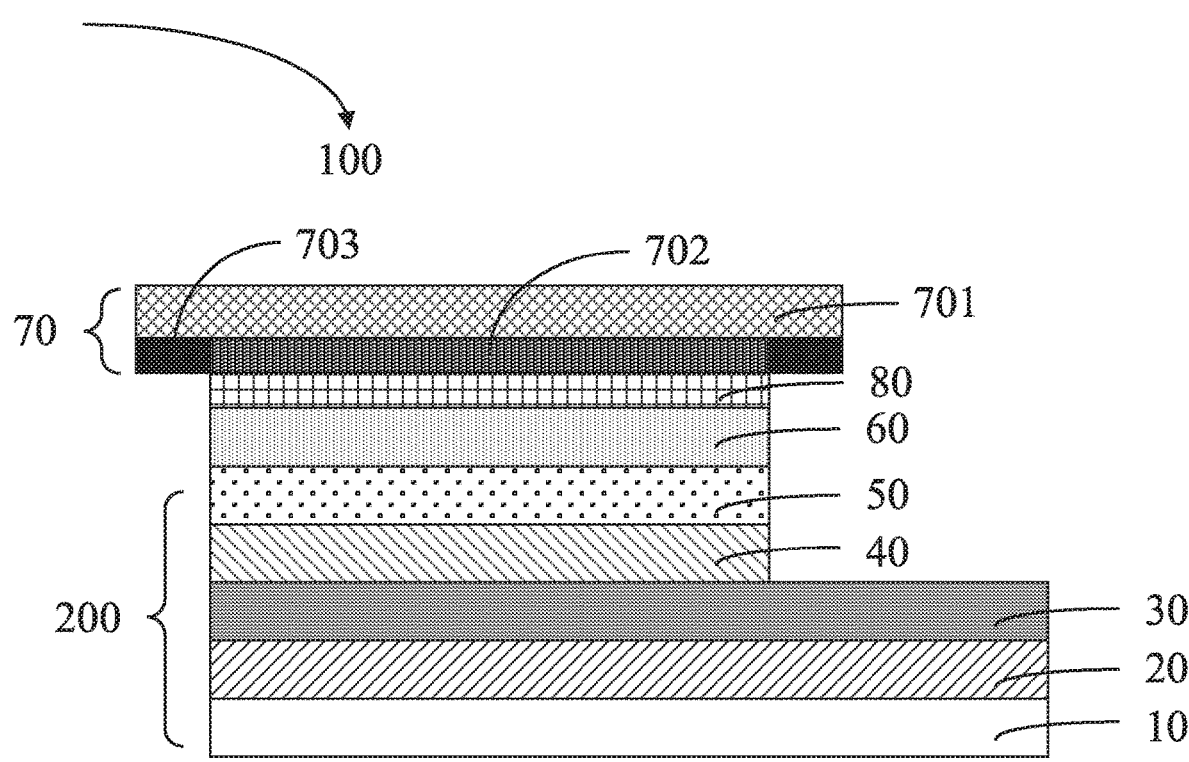
FIG. 1 illustrates a structural diagram of a display module formed by film layers according to a first embodiment of the present disclosure.

Please refer to FIG. 1 illustrating a structural diagram of a display module 100 formed by film layers according to a first embodiment of the present disclosure.

The display module includes a supporting layer, a back plate layer 10, and a display panel 200.

The supporting layer (not illustrated) serves as a substrate of the display module. The supporting layer is mainly configured to support a film layer structure on the supporting layer.

The back plate layer 10 is arranged on the supporting layer.

The display panel 200 is arranged on the back plate layer 10.

In one embodiment, a display panel may be an organic light-emitting diode (OLED) display or may be a flexible display of other kinds, which is not limited in the present disclosure.

The display panel includes a substrate 20 and a thin film transistor (TFT) layer 30 arranged on the substrate 20.

In another embodiment, a substrate 20 may be a flexible substrate. The flexible material for the flexible substrate is not limited in the present disclosure, such as a polyimide (PI) thin film.

The structure of the TFT layer 30 includes a type of etching barrier layer, a type of back channel etching, or a type of top-gate TFT, particularly not limited. For example, a TFT layer 30 of a top-gate type TFT may include a barrier layer, a buffer layer, an active layer, a first gate insulating layer, a gate, a second gate insulating layer, a second metal layer, an interlayer insulating layer, a source and a drain.

A light-emitting device layer 40 is arranged on the TFT layer 30.

The light-emitting device layer 40 includes an anode layer on the TFT layer 30, a light-emitting layer on the anode layer, and a cathode layer on the light-emitting layer.

In another embodiment, a light-emitting device is an organic light-emitting diode (OLED) device of a top-emitting type. The light-emitting device is a white-light OLED device which emits white light. Therefore, an anode layer is non-transparent reflective layer, and a cathode layer is a transparent metal layer.

The encapsulating layer 50 is arranged on the cathode layer. The encapsulating layer 50 may be deposited by means of chemical vapor deposition (CVD), sputter, atomic layer deposition (ALD), or vacuum deposition, ink-jet printing (IJP). The encapsulating layer 50 is configured to block water and prevent external moisture from eroding an organic light-emitting layer. The encapsulating layer 50 includes one or more organic layer and one or more inorganic layer, and the one or more organic layer and the one or more inorganic layer are alternately layered.

A polarizing layer 60 is arranged on the encapsulating layer 50.

The polarizing layer 60 may be attached directly onto the encapsulating layer 50 with an optical adhesive.

In another embodiment, a polarizing layer 60 may further be formed on an encapsulating layer 50 directly in a first deposition process without bonding the polarizing layer 60 to the encapsulating layer 50 with an optical adhesive.

The polarizing layer 60 includes a tri-cellulose acetate (TCA) layer and a polyvinyl alcohol (PVA) layer. The TAC layer and PVA layer may also be referred to as linearly polarizing layer.

The TAC layer plays a major role of supporting and protecting the PVA layer arranged below the TAC layer. The PVA layer is a core portion of the polarizing layer 60 and is configured to absorb a polarized state light of the natural light and obtain polarized light from light on another polarized state.

The adhesive layer 80 is arranged on the polarizing layer 60. The adhesive layer 80 is configured to bond the cover layer 70 on the adhesive layer 80 to the polarizing layer 60.

In another embodiment, an adhesive layer 80 is a viscosity-releasing adhesive layer.

In another embodiment, an adhesive layer 80 is an ultraviolet (UV) viscosity-releasing optical adhesive.

The cover layer 70 is arranged on the adhesive layer 80.

The cover layer 70 includes a hard layer 701 and a filter layer 702. The filter layer 702 is arranged between the hard layer 701 and the adhesive layer 80.

In another embodiment, a cover layer 70 further includes a light-shielding layer 703. The light-shielding layer 703 is arranged on a hard layer. The light-shielding layer 703 is arranged at both sides of a filter layer 702.

The process for producing the cover layer 70 can start in advance by bonding the adhesive layer 80 to the polarizing layer 60 directly.

The adhesive layer 80 is a UV viscosity-releasing optical adhesive. Whenever the display module is subjected to UV light in daily use, the adhesive layer loses the viscosity gradually. Lack of the viscosity causes the cover layer 70 to be separated from the polarizing layer 60 easily, thereby lowering the quality of the display module.

In another embodiment, a filter layer 702 is an ultraviolet (UV) filter layer to prevent an adhesive layer 80 from losing the viscosity.

In another embodiment, an orthographic projection of a light-emitting device layer 40 on a filter layer 702 is arranged in the filter layer 702. The area of the filter layer 702 is greater than the area of the light-emitting region of a display module. Further, the adhesive layer 80 maintains viscous.

A non-light-emitting region is in the display module. To prevent leakage of light from the periphery of the display module, the light-shielding layer 703 is arranged on the edging area of the display module.

In another embodiment, materials for a light-shielding layer 703 may be ink or black optical adhesive.

In another embodiment, the sum of the area of a light-shielding layer 703 and the area of a filter layer 702 is equal to the area of a hard layer.

The display module further includes a touch layer (not illustrated) and a color film layer (not illustrated) arranged between the encapsulating layer 50 and the cover layer 70. The location of the touch layer and the location of the color film layer are not limited specifically in the present disclosure.

Figure 2:
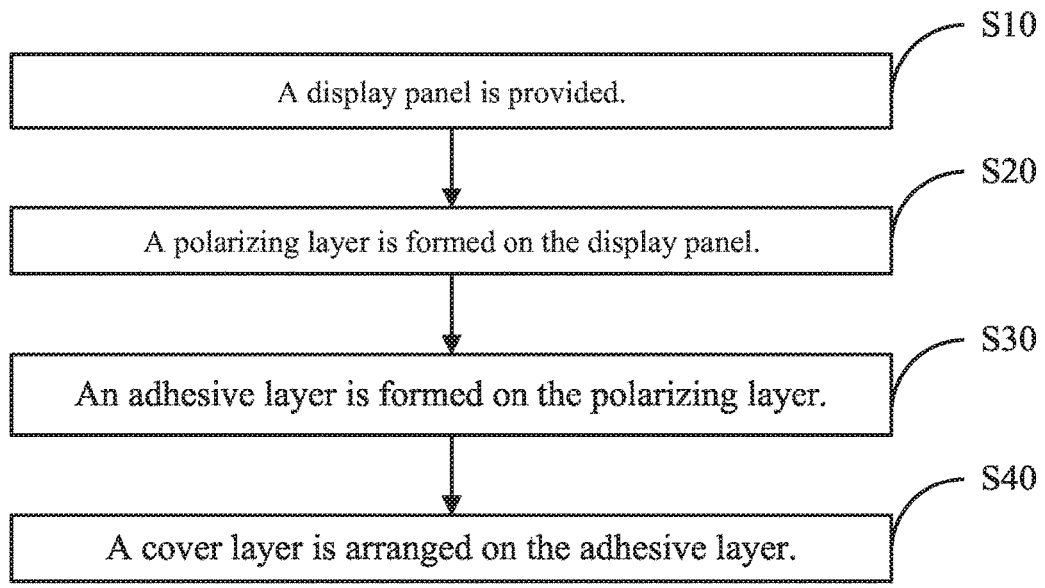
FIG. 2 illustrates a flowchart of a method of manufacturing the display module according to a second embodiment of the present disclosure.

Please refer to FIG. 2 illustrating a flowchart of a method of manufacturing the display module according to a second embodiment of the present disclosure.

Figure 3A:
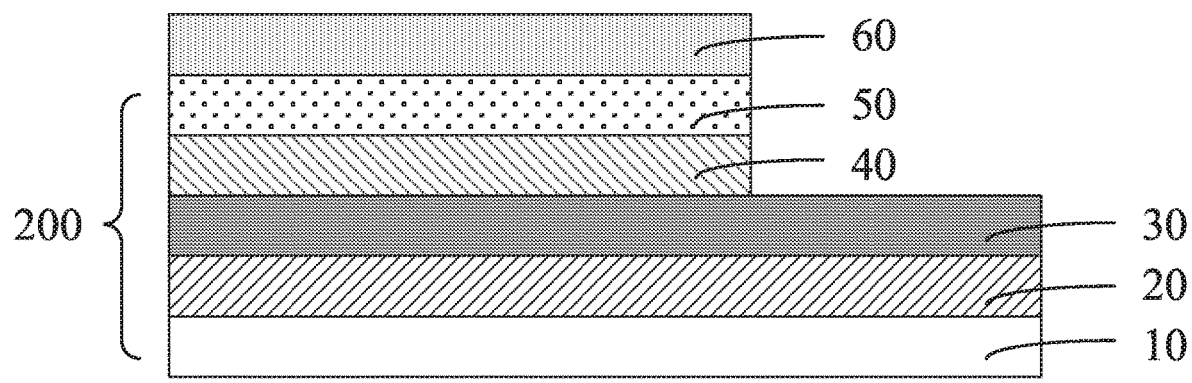
FIGS. 3A, 3B and 3C illustrate a flowchart of a method of manufacturing the display module according to an embodiment of the present disclosure.
Figure 3B:
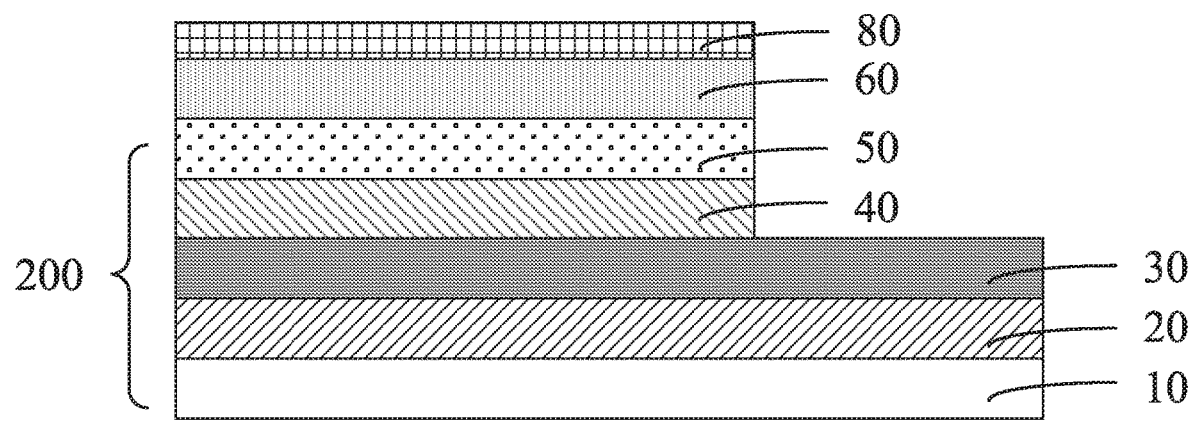
Figure 3C:
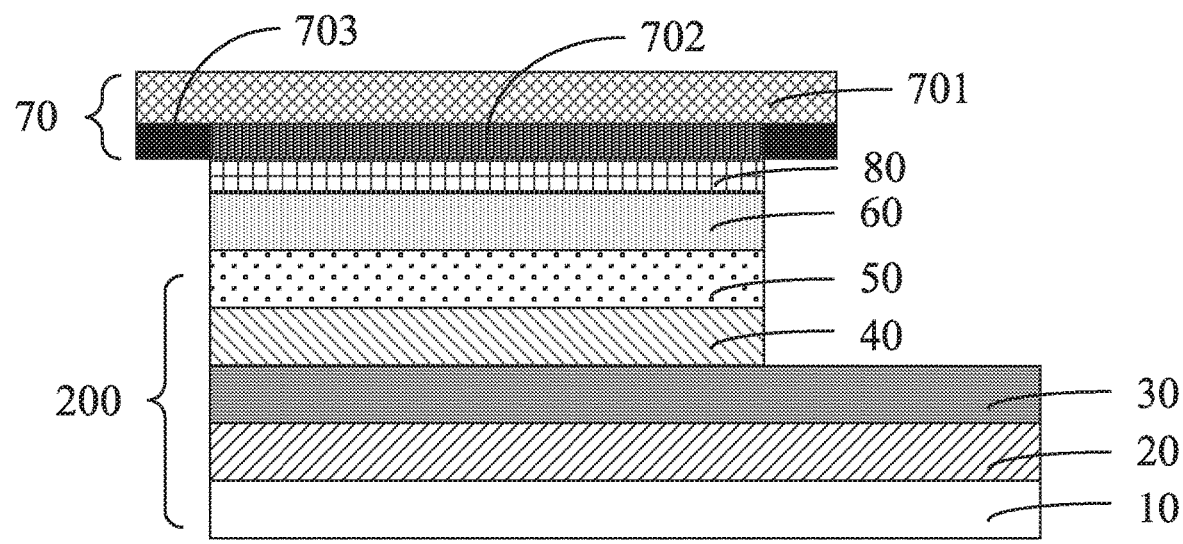

FIG. 3A to FIG. 3C illustrate a flowchart of a method of manufacturing the display module according to an embodiment of the present disclosure.

The method of manufacturing the display module includes block S10, block S20, block S30, and block S40.

At block S10, a display panel is provided.

Please refer to FIG. 3A. The display panel includes a back plate layer 10, a substrate 20 arranged on the back plate layer 10, a thin film transistor (TFT) layer 30 arranged on the substrate 20, a light-emitting device layer 40 arranged on the TFT layer 30, and an encapsulating layer 50 on the light-emitting device layer 40.

In another embodiment, a display panel may be an organic light-emitting diode (OLED) display or may be a flexible display of other kinds, which is not limited in the present disclosure.

The display module further includes a supporting layer (not illustrated). The supporting layer (not illustrated) serves as a substrate of the display module. The supporting layer is mainly configured to support a film structure of the supporting layer.

The back plate layer 10 is arranged on the supporting layer.

The display panel 200 is arranged on the back plate layer 10.

In another embodiment, a substrate 20 may be a flexible substrate. The flexible material may be a polyimide (PI) thin film, which is not limited in the present disclosure actually.

The structure of the TFT layer 30 includes a type of etching barrier layer, a type of back channel etching, or a type of top-gate TFT, which is not limited specifically. For example, a TFT layer 30 of a top-gate type TFT may include a barrier layer, a buffer layer, an active layer, a first gate insulating layer, a gate, a second gate insulating layer, a second metal layer, an interlayer insulating layer, a source and a drain.

A light-emitting device layer 40 is arranged on the TFT layer 30. The light-emitting device layer 40 includes an anode layer on the TFT layer 30, a light-emitting layer on the anode layer, and a cathode layer on the light-emitting layer.

In another embodiment, a light-emitting device is an OLED device of a top-emitting type. The light-emitting device is a white-light organic light-emitting diode (OLED) device which emits white light. Therefore, an anode layer is non-transparent reflective layer, and a cathode layer is a transparent metal layer.

The encapsulating layer 50 is arranged on the cathode layer. The encapsulating layer 50 may be deposited by means of chemical vapor deposition (CVD), sputter, atomic layer deposition (ALD), vacuum deposition, ink-jet printing (IJP), etc. The encapsulating layer 50 is mainly configured to block water and prevents external moisture from eroding an organic light-emitting layer. The encapsulating layer 50 includes one or more organic layer and one or more inorganic layer, and the one or more organic layer and the one or more inorganic layer are alternately layered.

At block S20, a polarizing layer 60 is formed on the display panel.

Please refer to FIG. 3A. The polarizing layer 60 may be attached directly onto the encapsulating layer 50 with an optical adhesive.

In another embodiment, a polarizing layer 60 may further be formed on an encapsulating layer 50 directly in a first deposition process without bonding the polarizing layer 60 to the encapsulating layer 50 with an optical adhesive.

The polarizing layer 60 includes a tri-cellulose acetate (TCA) layer and a polyvinyl alcohol (PVA) layer. The TAC layer and PVA layer may also be referred to as linearly polarizing layer.

The TAC layer plays a major role of supporting and protecting the PVA layer arranged below the TAC layer. The PVA layer is a core portion of the polarizing layer 60 and is mainly configured to absorb a polarized state light of the natural light and obtain polarized light from light on another polarized state.

At block S30, an adhesive layer 80 is formed on the polarizing layer 60.

Please refer to FIG. 3B. The adhesive layer 80 is arranged on the polarizing layer 60. The adhesive layer 80 is configured to bond the cover layer 70 on the adhesive layer 80 to the polarizing layer 60.

In another embodiment, an adhesive layer 80 is a viscosity-releasing adhesive layer.

In another embodiment, an adhesive layer 80 is an ultraviolet (UV) viscosity-releasing optical adhesive.

At block S40, a cover layer 70 is arranged on the adhesive layer 80.

Please refer to FIG. 3C. Block S40 includes block S401, block S402, block S403, and block S404.

At block S401, a hard layer 701 is provided.

At block S402, a filter layer 702 is formed on the hard layer 701.

At block S403, a shielding layer 703 is formed at both sides of the filter layer 702.

At block S404, the hard layer 701 where the filter layer 702 is formed is bonded to the polarizing layer 60 with the adhesive layer 80.

At block S404, the process for producing the cover layer 70 can start in advance by bonding the adhesive layer 80 to the polarizing layer 60 directly.

The adhesive layer 80 is a UV viscosity-releasing optical adhesive. Whenever the display module is subjected to UV light in daily use, the adhesive layer loses the viscosity gradually. Lack of the viscosity causes the cover layer 70 to be separated from the polarizing layer 60 easily, thereby lowering the quality of the display module.

In another embodiment, a filter layer 702 is an ultraviolet (UV) filter layer to prevent an adhesive layer 80 from losing the viscosity.

In another embodiment, an orthographic projection of a light-emitting device layer 40 on a filter layer 702 is arranged in the filter layer 702. The area of the filter layer 702 is greater than the area of the light-emitting region of a display module. Further, the adhesive layer 80 maintains viscous.

A non-light-emitting region is in the display module. To prevent leakage of light from the periphery of the display module, the light-shielding layer 703 is arranged on the edging area of the display module.

In another embodiment, materials for a light-shielding layer 703 may be ink or black optical adhesive.

In another embodiment, the sum of the area of a light-shielding layer 703 and the area of a filter layer 702 is equal to the area of a hard layer.

The display module further includes a touch layer (not illustrated) and a color film layer (not illustrated) arranged between the encapsulating layer 50 and the cover layer 70. The location of the touch layer and the location of the color film layer are not limited specifically in the present disclosure.

The present disclosure further provides an electronic device. The electronic device includes a display module as introduced above. The electronic device includes, but is not limited to, living appliances with a display function, such as a cellphone, a tablet computer, a computer display, a game machine, a television, a display, and wearable device, or household appliances with a display function.

The operating principle of the electronic device is similar to the operating principle of the display module. For details, please refer to the operating principle of the display module directly. In other words, the operating principle of the electronic device will not be detailed anymore.

The present disclosure proposes a display module, a manufacturing method and an electronic device. The display module includes a display panel, a polarizing layer on the display panel, a cover layer on the polarizing layer, and an adhesive layer between the polarizing layer and the cover layer. The adhesive layer is a viscosity-releasing adhesive layer. In the present disclosure, an ultraviolet (UV) release adhesive layer is substituted for an adhesive layer arranged between a cover layer and a polarizing layer. It is because that it is easy to lose the viscosity after the UV viscosity-releasing adhesive layer is subjected to UV light. Lack of the viscosity, the UV viscosity-releasing adhesive layer is separated from the polarizing layer easily. Further, the successful repairing rate for the display module is greatly improved.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A display module, comprising: a display panel; a polarizing layer, arranged on the display panel; a cover layer, arranged on the polarizing layer; and an adhesive layer, arranged directly between the polarizing layer and the cover layer; wherein the adhesive layer is a viscosity-releasing adhesive layer, wherein the cover layer comprises: a hard layer; and a filter layer sandwiched between the hard layer and the adhesive layer; wherein the display panel comprises a light-emitting device layer of which an orthographic projection on the filter layer is arranged in the filter layer.

2. The display module of claim 1, wherein the adhesive layer is an ultraviolet (UV) viscosity-releasing optical adhesive.

3. The display module of claim 1, wherein an area of the filter layer is greater than an area of a light-emitting region of the display module.

4. The display module of claim 1, wherein the cover layer further comprises a light-shielding layer; the light-shielding layer is arranged on the hard layer and at both sides of the filter layer;

a sum of an area of the light-shielding layer and an area of the filter layer is equal to an area of the hard layer.

5. The display module of claim 4, wherein a material for the light-shielding layer comprise ink.

6. A method of manufacturing a display module, comprising:
providing a display panel;
forming a polarizing layer on the display panel;
forming an adhesive layer on the polarizing layer;
forming a cover layer on the adhesive layer;
wherein the adhesive layer is a viscosity-releasing adhesive layer,
wherein the step of forming the cover layer on the adhesive layer comprises:
providing a hard layer;
forming a filter layer on the hard layer;
forming a light-shielding layer at both sides of the filter layer;
bonding the filter layer to the polarizing layer with the adhesive layer;
wherein a sum of the area of the light-shielding layer and the area of the filter layer is equal to the area of the hard layer.

7. The method of claim 6, wherein the adhesive layer is an ultraviolet (UV) viscosity-releasing optical adhesive.

8. The method of claim 6, wherein an area of the filter layer is greater than an area of a light-emitting region of the display module.

9. The method of claim 6, wherein the display panel comprises a light-emitting device layer of which an orthographic projection on the filter layer is arranged in the filter layer.

10. The method of claim 9, wherein a material for the light-shielding layer comprise ink.

11. The method of claim 6, wherein the filter layer is an ultraviolet (UV) filter layer.

12. An electronic device comprising a display module, the display module comprising: a display panel; a polarizing layer, arranged on the display panel; a cover layer, arranged on the polarizing layer; and an adhesive layer, arranged directly between the polarizing layer and the cover layer; wherein the adhesive layer is a viscosity-releasing adhesive layer, wherein the cover layer comprises: a hard layer; and a filter layer sandwiched between the hard layer and the adhesive layer; wherein the display panel comprises a light-emitting device layer of which an orthographic projection on the filter layer is arranged in the filter layer.

13. The electronic device of claim 12, wherein the adhesive layer is an ultraviolet (UV) viscosity-releasing optical adhesive.

14. The electronic device of claim 12, wherein an area of the filter layer is greater than an area of a light-emitting region of the display module.

15. The electronic device of claim 12, wherein the cover layer further comprises a light-shielding layer; the light-shielding layer is arranged on the hard layer and at both sides of the filter layer;
    a sum of an area of the light-shielding layer and an area of the filter layer is equal to an area of the hard layer.

16. The electronic device of claim 15, wherein a material for the light-shielding layer comprise ink.

17. The electronic device of claim 12, wherein the filter layer is an ultraviolet (UV) filter layer.

* * * * *